US006803156B2

(12) United States Patent
    Akbar

(10) Patent No.: US 6,803,156 B2
(45) Date of Patent: Oct. 12, 2004

(54) ELECTROSTATIC DAMAGE (ESD) PROTECTED PHOTOMASK

(75) Inventor: Shahzad Akbar, Colonial Heights, VA (US)

(73) Assignee: Infineon Technologies Richmond, LP, Sandston, VA (US)

( * ) Notice: Subject to any disclaimer, the term of this patent is extended or adjusted under 35 U.S.C. 154(b) by 285 days.

(21) Appl. No.: 09/920,504

(22) Filed: Aug. 1, 2001

(65) Prior Publication Data

US 2003/0031934 A1 Feb. 13, 2003

(51) Int. Cl.⁷ .............................. G03F 9/00; G03C 5/00
(52) U.S. Cl. .......................................... 430/5; 430/324
(58) Field of Search ........................... 430/5, 322, 323, 430/324; 378/34, 35; 716/19

(56) References Cited

U.S. PATENT DOCUMENTS

| 5,989,954 | A | 11/1999 | Lee et al. | |
| 6,440,617 | B1 * | 8/2002 | Deng et al. | 430/5 |
| 2002/0115001 | A1 * | 8/2002 | Hsue et al. | 430/5 |

* cited by examiner

Primary Examiner—Saleha R. Mohamedulla
(74) Attorney, Agent, or Firm—Slater & Matsil, L.L.P.

(57) ABSTRACT

A photomask (8) protected against electrostatic damage and a method of manufacturing such a photomask is disclosed. The photomask (8) comprises a transparent substrate (10) on which is deposited an opaque pattern such as lines (12), (14), (16) and (18). A transparent conductive film (30) is deposited over the substrate (10) and pattern such that the various portions of the pattern (lines (12), (14), (16) and (18)) are all maintained at the same electrical potential thereby preventing damage due to an electrostatic discharge.

36 Claims, 1 Drawing Sheet

US 6,803,156 B2

ELECTROSTATIC DAMAGE (ESD) PROTECTED PHOTOMASK

TECHNICAL FIELD

The present invention is related to photolithography and photomasks used in the fabrication of semiconductor microchips and more particularly to preventing or reducing the damage caused by the discharge of electrostatic fields between metallic patterns on the reticle plate or photomask.

BACKGROUND OF THE INVENTION

Electrostatic damage (ESD) is a well-known and commonly understood phenomenon in microelectronics. This phenomenon seriously impacts photomasks used in the fabrication of micro circuitry and results in unexpected and undiscovered defects on the reticle or photomask which can then be used to print defective semiconductor chips causing substantial yield and photolithographic manufacturing problems in semiconductor fabrication lines.

ESD events or discharges can occur on reticles when a build-up charge on one portion of the pattern discharges or causes a current to flow from one portion of the pattern to any surrounding point that is not at the same potential. If the potential difference is sufficient to cause breakdown of the intervening insulating medium, the metallic pattern such as chromium or molybdenum may melt or evaporate and then the melted metallic vapors or material may be re-deposited in the spaces between the intended pattern lines or shapes. This will generate undesired defects that will then be printed on the silicon wafer. As will be understood by those skilled in the art, if the defective photomask is not detected at the time the ESD event occurs, the defective photomask may be used to print thousands and thousands of microchips on various wafers. It is then not until later testing and quality control that the defect would be discovered. By that time, millions of dollars may have been lost due to the defective photomask.

It is not the electrostatic charging alone which causes damage to the reticles, it is the actual discharge between two isolated portions of the pattern (usually metallic) having different potentials. Various techniques already exist for the dissipative discharging of the charge on the mask and include ionized air, conductive glows, conductive shoes, floor mats, hand bands, and the use of electrically conductive materials of construction of the reticle carriers in transportation pods. Unfortunately, the charge still builds up in a significant number of cases, and it is the discharge which causes the damage.

SUMMARY OF THE INVENTION

Therefore, it is an object of the present invention to provide a low cost photomask or reticle and method of manufacturing such a reticle or photomask that provides substantial protection against ESD damage.

It is another object of the present invention to provide a method of manufacturing reticles and photomasks and to produce a resulting reticle and photomask which does not require the costly procedures of preventing an electrostatic buildup on a reticle or photomask.

These and other objects are achieved by the present invention which comprises a photomask and a method of manufacturing a photomask which is protected against ESD or electrostatic damage. According to the invention, there is included a substrate such as fused quartz or silica which is transparent to the wavelength of light used for printing circuits or microchips on a wafer. The substrate includes a front face and a back face with a pattern permanently applied or adhered to the front face. The pattern is opaque to the wavelength of light used for printing and is typically a metal such as chromium and molybdenum suicide. A conductive film which is also transparent to light having a wavelength used for printing is deposited at least over those portions of the front face of the substrate not covered by the opaque pattern. For example, according to one embodiment, the conductive transparent film covers the entire front face including a previously deposited pattern. However, according to another embodiment, the conductive transparent film is deposited before the pattern is deposited and covers the entire front face. The pattern is then deposited over the combination substrate and conductive transparent film. The "transparent" conductive film is selected from a group of materials consisting of ITO (Indium Tin Oxide), Palladium, Platinum, Gold and conductive polymers depending on the wavelength of the light chosen for printing. In addition, the thickness of the deposited layer of film will also be dependent upon the wavelength of the light used for printing.

BRIEF DESCRIPTION OF THE DRAWINGS

These and other features of the present invention will be more fully disclosed when taken in conjunction with the following detailed description of embodiments of the invention in which.

Corresponding numerals and symbols in the different figures refer to corresponding parts unless otherwise indicated. The figures are drawn to clearly illustrate the relevant aspects of the preferred embodiments, and are not necessarily drawn to scale.

DETAILED DESCRIPTION OF PREFERRED EMBODIMENTS

Figure 1:
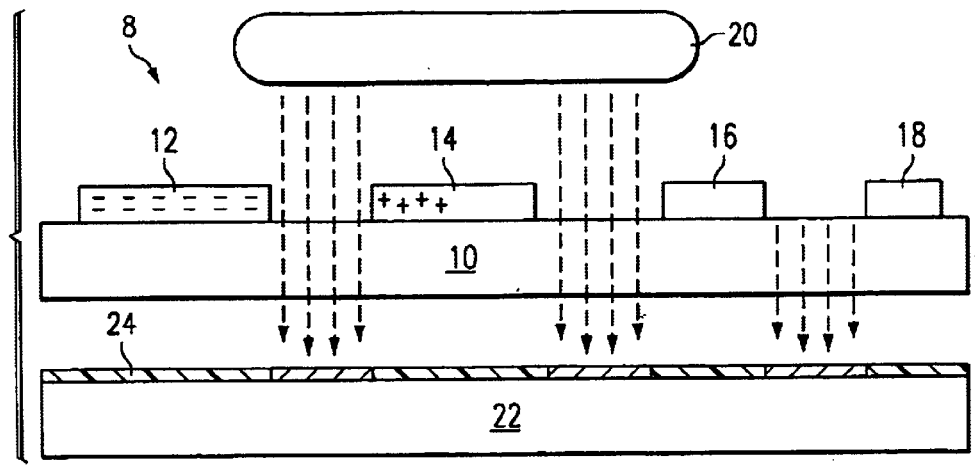
FIGS. 1 and 1a are an illustration of a cross-section of a prior art reticle or photomask on a transparent substrate.

Referring now to FIG. 1, there is shown a photomask 8 comprising a substrate 10 for supporting the pattern to be used in a photolithography process for printing circuits on a silicon wafer. As is understood by those skilled in the art, substrate 10 of the photomask 8 is made of a transparent material such as, for example, fused quartz or silica. The pattern, on the other hand, used for creating the lines or conductors (i.e. circuits) on the wafer or chip is made from a material that is opaque to the light used for the printing process. Typically, the patterns are made from a metallic material such as chromium or molybdenum silicide. As shown in the drawings, the metallic patterns 12, 14, 16 and 18 of photomask 8 are deposited on the transparent fused silica substrate 10 such that when light from source 20 is directed at the reticle or photomask 8, the light produces a negative of the image of the pattern on a wafer substrate 22 having a photoresist layer 24.

Figure 1A:
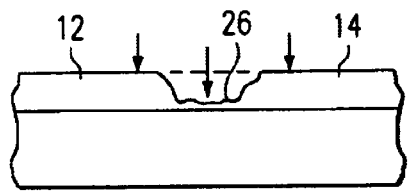

In the past, and prior to the present invention, damage often occurred to the photomask 8 when an electrostatic charge would build up on one of the lines or metallic strips comprising the pattern such as line 12 shown in FIG. 1a. Since it would not be uncommon for the adjoining line shown as pattern portion 14 to be electrically isolated from pattern portion 12, a similar charge may not build up on pattern portion 14. Consequently, an insulation break down between the two portions 12 and 14 would often occur either through the air which will be seen as a spark between portions 12 and 14 or along the surface of the semiconductor 10. Even though the discharge occurred over an extremely short period of time, the potential voltage between the two portions 12 and 14 would often be sufficiently great that significant current would actually flow for this extremely short period of time. Consequently, metal of the two pattern portions 12 and 14 would vaporize or melt sufficiently to actually cause a metallic path 26 between the two pattern portions 12 and 14. Thus, when a path 26 was formed, it is obvious that the resulting exposure through the photomask 8 into the silicon wafer 22 was not the same as the intended pattern.

Figure 2:
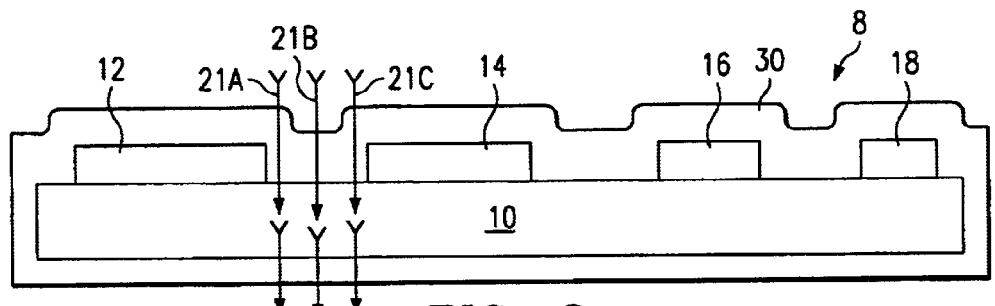
FIG. 2 shows a cross-section and an enlarged cross-section of one embodiment of the present invention.

Referring now to FIG. 2, there is shown a first embodiment of the present invention. It should be noted that common portions of the invention shown in FIG. 2 which are the same as those portions of the prior art FIG. 1 will maintain the same reference numbers. As shown, most of the pattern and figure elements are similar. However, there is also shown a thin film 30 of an electrically conductive material which is transparent to the wavelengths of light 21a, 21b and 21c used for printing on the surface of the wafer 22. Thus, it is seen, that the non-conductive or insulating fused quartz, or fused silica substrate shown as plate 10 upon which is deposited the opaque line patterns (typically made from chromium or molybdenum silicide) is covered with an ultra thin film of an electrically conducting but optically transmitting material 30. Consequently, all of the opaque patterns or line traces will now be at the same electrostatic surface potential. This means of course that high voltage differences cannot be generated between adjacent patterns. This prevents damage due to electrostatic discharge.

As is well-known by those skilled in the art, various types of light having different wavelengths are used in the photolithographic process. Further, it will be appreciated that if the reticle or photomask 8 of the present invention shown in FIG. 2 is to be used, the ultra thin conductive film 30 must be transparent to the wavelength of light used for printing on the silicon wafer. Consequently, the choice and thickness of the electrically conducting optically transmitting thin film 30 will depend upon the light wavelength used for the photolithographic process. Examples of suitable types of materials to be used for the ultra thin film 30 when printing with different wavelengths of light is shown in Table 1.

TABLE 1

| Photolithographic Wavelength | Thin Film Material | Thin Film Thickness |
| --- | --- | --- |
| 436 nm | Indium Tin Oxide | 100 A |
| 248 nm | Palladium | 30 A |
| 193 nm | Palladium, Platinum, Gold or conductive polymer | 30–100 A |

Tests have indicated that depending upon the material composition and the deposition conditions, the optical transmission on the ultra thin film 30 can be between 85 and 90% of the operating wavelength, and the electrical conductivity can also be controlled by the deposition parameters, the material composition, and the film thickness.

It will also be appreciated by those skilled in the art, that there are various types of photomasks used in the fabrication of silicon wafers. These include, as examples only, the standard chrome-on-glass (COG), the attenuated phase shift mask (PSM), alternating phase shift mask (Alt-PSM), optical process correction (OPC), and a flat panel display (FPD) masks. All of the photomasks can be initially fabricated using normal manufacturing procedures.

However, after the mask is made but before the pellicle is mounted, according to this embodiment of the present invention, the photomask is coated with the appropriate thin film discussed above with respect to Table 1. Suggested methods of deposition for these different materials are shown in Table 2.

TABLE 2

| Thin Film Material | Thin Film Thickness | Deposition Method |
| --- | --- | --- |
| Palladium | 30–50 A | Sputter Deposition |
| Indium Tin Oxide | 100 A | Reactive Sputter Deposition |
| Conductive Polymer | 100 A | PECVD (Phase Enhanced Chemical Vapor Deposition) or Langmuir-- Blodgett |

Thus, the electrical conductivity, the film integrity and the optical transmission of the thin film can be tested and once proved satisfactory, the pellicle can be mounted and the mask used in the photolithographic camera.

Figure 3:
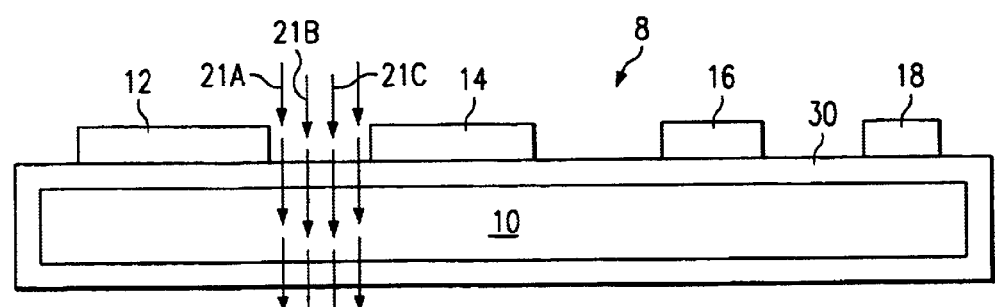
FIG. 3 shows a cross-section and an enlarged cross-section of an alternate embodiment of the present invention.

Referring now to FIG. 3, there is shown an alternate embodiment of the present invention. According to this embodiment, the electrically conducting optically transmitting thin film 30 is deposited over the fused quartz or silica transparent substrate 10 prior to the deposition of the photomask lines or pattern. The chromium thin film is then deposited by sputter deposition on top of the film 30 coated substrate 10. The photomask is then fabricated by conventional methods of using an electron or laser pattern generator on the photoresist. The pattern is then etched into the chromium layer. However, at this point, it will be necessary that the wet or dry etch chemistry be adjusted to make it selective to the underlying optical transmitting thin film. In this situation, the fused quartz or silica photomask substrate or blank wafer would basically be surrounded by its own Faraday Cage at an early stage of the reticle fabrication, and therefore, would provide protection from electrostatic damage throughout the manufacturing, transportation, storage and used process in the production of a reticle or photomask.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. In addition, the order of process steps may be rearranged by one of ordinary skill in the art, yet still be within the scope of the present invention. It is therefore intended that the appended claims encompass any such modifications or embodiments. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A photomask protected against electrostatic damage comprising:
   a substrate having a front face and a back face, said substrate being transparent at least to light having a selected wavelength used for printing;
   a conductive film which is transparent to said light having said selected wavelength used for printing, said conductive film deposited so as to form a cover over said front face of said substrate; and
   a pattern permanently applied over and in contact with said conductive film covering said front face of said substrate, said pattern being opaque to said light having said selected wavelength used for printing.

2. The photomask of claim 1 wherein said conductive film further covers said back face of said substrate, thereby forming a Faraday cage around said photomask.

3. The photomask of claim 1 wherein said conductive film covers substantially all of said front face of said substrate and said opaque pattern is permanently secured to said conductive film covering said front face of said substrate.

4. The photomask of claim 3 wherein said conductive film further covers said back face of said substrate thereby forming a Faraday cage around said photomask.

5. The photomask of claim 1 wherein said substrate is fused silica.

6. The photomask of claim 3 wherein said substrate is fused silica.

7. The photomask of claim 1 wherein said opaque pattern is made of a material selected from the group consisting of Chromium and Molybdenum suicide.

8. The photomask of claim 3 wherein said opaque pattern is made of a material selected from the group consisting of Chromium and Molybdenum suicide.

9. The photomask of claim 5 wherein said opaque pattern is made of a material selected from the group consisting of Chromium and Molybdenum silicide.

10. The photomask of claim 1 wherein said conductive film is made from a material selected from the group consisting of ITO (Indium Tin Oxide), Palladium, Platinum, Gold and conductive polymers.

11. The photomask of claim 3 wherein said conductive film is made from a material selected from the group consisting of ITO (Indium Tin Oxide), Palladium, Platinum, Gold and conductive polymers.

12. The photomask of claim 5 wherein said conductive film is made from a material selected from the group consisting of ITO (Indium Tin Oxide), Palladium, Platinum, Gold and conductive polymers.

13. The photomask of claim 7 wherein said conductive film is made from a material selected from the group consisting of ITO (Indium Tin Oxide), Palladium, Platinum, Gold and conductive polymers.

14. The photomask of claim 8 wherein said conductive film is made from a material selected from the group consisting of ITO (Indium Tin Oxide), Palladium, Platinum, Gold and conductive polymers.

15. The photomask of claim 9 wherein said conductive film is made from a material selected from the group consisting of ITO (Indium Tin Oxide), Palladium, Platinum, Gold and conductive polymers.

16. The photomask of claim 1 wherein said light used for printing has a wavelength of 436 nm (nanometer) and said conductive film is ITO deposited to a thickness of about 100 Angstroms.

17. The photomask of claim 3 wherein said light used for printing has a wavelength of 436 nm (nanometer) and said conductive film is ITO deposited to a thickness of about 100 Angstroms.

18. The photomask of claim 5 wherein said light used for printing has a wavelength of 436 nm (nanometer) and said conductive film is ITO deposited to a thickness of about 100 Angstroms.

19. The photomask of claim 9 wherein said light used for printing has a wavelength of 436 nm (nanometer) and said conductive film is ITO deposited to a thickness of about 100 Angstroms.

20. The photomask of claim 1 wherein said light used for printing has a wavelength of about 248 nm (nanometer) and said conductive film is Palladium deposited to a thickness of about 30 Angstroms.

21. The photomask of claim 3 wherein said light used for printing has a wavelength of about 248 nm (nanometer) and said conductive film is Palladium deposited to a thickness of about 30 Angstroms.

22. The photomask of claim 5 wherein said light used for printing has a wavelength of about 248 nm (nanometer) and said conductive film is Palladium deposited to a thickness of about 30 Angstroms.

23. The photomask of claim 9 wherein said light used for printing has a wavelength of about 248 nm (nanometer) and said conductive film is Palladium deposited to a thickness of about 30 Angstroms.

24. The photomask of claim 1 wherein said light used for printed has a wavelength of about 193 nm (nanometer) and said conductive film is a material selected from the group consisting of Palladium, Platinum, Gold and conductive polymers deposited to a thickness of between about 30 Angstroms and 100 Angstroms.

25. The photomask of claim 3 wherein said light used for printed has a wavelength of about 193 nm (nanometer) and said conductive film is a material selected from the group consisting of Palladium, Platinum, Gold and conductive polymer deposited to a thickness of between about 30 Angstroms and 100 Angstroms.

26. The photomask of claim 5 wherein said light used for printed has a wavelength of about 193 nm (nanometer) and said conductive film is a material selected from the group consisting of Palladium, Platinum, Gold and conductive polymers deposited to a thickness of between about 30 Angstroms and 100 Angstroms.

27. The photomask of claim 9 wherein said light used for printed has a wavelength of about 193 nm (nanometer) and said conductive film is a material selected from the group consisting of Palladium, Platinum, Gold and conductive polymers deposited to a thickness of between about 30 Angstroms and 100 Angstroms.

28. A method of manufacturing a photomask protected against electrical damage, comprising;
   providing a substrate having a front face and a back face, said substrate being transparent to a selected light wavelength used far printing;
   depositing a conductive film so as to form a cover over said front face of said substrate, said conductive film being in electrical contact with an applied pattern and transparent to said light having a selected wavelength used for printing; and then
   permanently applying a pattern over said front face which is opaque to said light having a selected wavelength used for printing.

29. The method of claim 28 wherein said substrate is fused silica.

30. The method of claim 28 wherein said opaque pattern is made from a material selected from the group consisting of Chromium and Molybdenum Suicide.

31. The method of claim 29 wherein said opaque pattern is made from a material selected from the group consisting of Chromium and Molybdenum Silicide.

32. The method of claim 28 wherein said conductive film is made from a material selected from the group consisting of ITO (Indium Tin Oxide), Palladium, Platinum, Gold and conductive polymers.

33. The method of claim 29 wherein said conductive film is made from a material selected from the group consisting of ITO (Indium Tin Oxide), Palladium, Platinum, Gold and conductive polymers.

34. The method of claim 32 wherein said conductive film is ITO deposited to a thickness of about 100 Angstroms.

35. The method of claim 32 wherein said conductive film is made from a material selected from the group consisting of Palladium, Platinum, Gold and conductive polymer and is deposited to a thickness between about 30 Angstroms and 100 Angstrom.

36. The method of claim 33 wherein said conductive film is made from a material selected from the group consisting of Palladium, Platinum, Gold and conductive polymer and is deposited to a thickness between about 30 Angstroms and 100 Angstroms.

* * * * *

UNITED STATES PATENT AND TRADEMARK OFFICE
CERTIFICATE OF CORRECTION

PATENT NO. : 6,803,156 B2  Page 1 of 1
DATED : October 12, 2004
INVENTOR(S) : Akbar It is certified that error appears in the above-identified patent and that said Letters Patent is hereby corrected as shown below:

<u>Column 6,</u>
Line 53, delete "far" and insert -- for --.

Signed and Sealed this

Fourteenth Day of December, 2004

JON W. DUDAS
*Director of the United States Patent and Trademark Office*